US008647967B2

(12) United States Patent
Saito et al.

(10) Patent No.: US 8,647,967 B2
(45) Date of Patent: Feb. 11, 2014

(54) HEXAGONAL WURTZITE TYPE EPITAXIAL LAYER POSSESSING A LOW ALKALI-METAL CONCENTRATION AND METHOD OF CREATING THE SAME

(75) Inventors: Makoto Saito, Santa Barbara, CA (US); Shin-Ichiro Kawabata, Santa Barbara, CA (US); Derrick S. Kamber, Goleta, CA (US); Steven P. DenBaars, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 885 days.

(21) Appl. No.: 12/474,143

(22) Filed: May 28, 2009

(65) Prior Publication Data

US 2009/0294775 A1 Dec. 3, 2009

Related U.S. Application Data

(60) Provisional application No. 61/056,724, filed on May 28, 2008.

(51) Int. Cl.
*H01L 21/20* (2006.01)
(52) U.S. Cl.
USPC .................................. 438/478; 257/E21.108

(58) Field of Classification Search
None
See application file for complete search history.

(56) References Cited

U.S. PATENT DOCUMENTS

| 5,006,908 A | 4/1991 | Matsuoka et al. |
| 2003/0164138 A1 | 9/2003 | Sarayama et al. |
| 2006/0054075 A1* | 3/2006 | Dwilinski et al. ............... 117/2 |
| 2007/0040240 A1 | 2/2007 | Dwilinkski et al. |
| 2007/0252164 A1 | 11/2007 | Zhong et al. |

FOREIGN PATENT DOCUMENTS

| JP | 2003-206198 | 7/2003 |
| JP | 2004-111514 | 4/2004 |

OTHER PUBLICATIONS

International Search Report, International application No. PCT/US2009/045524, International filing date May 28, 2009.
Japanese Office Action dated Jun. 27, 2013 for JP application No. 2011-511830.

* cited by examiner

*Primary Examiner* — Michael Lebentritt
*Assistant Examiner* — Kevin Quinto
(74) *Attorney, Agent, or Firm* — Gates & Cooper LLP

(57) ABSTRACT

A method of obtaining a hexagonal würtzite type epitaxial layer with a low impurity concentration of alkali-metal by using a hexagonal würtzite substrate possessing a higher impurity concentration of alkali-metal, wherein a surface of the substrate upon which the epitaxial layer is grown has a crystal plane which is different from the c-plane.

23 Claims, 4 Drawing Sheets

HEXAGONAL WURTZITE TYPE EPITAXIAL LAYER POSSESSING A LOW ALKALI-METAL CONCENTRATION AND METHOD OF CREATING THE SAME

CROSS-REFERENCE TO RELATED APPLICATIONS

This application claims the benefit under 35 U.S.C. 119(e) of the following co-pending and commonly-assigned U.S. patent application:

U.S. Patent Application Ser. No. 61/056,724, filed on May 28, 2008, by Makoto Saito et al., entitled "HEXAGONAL WÜRTZITE TYPE EPITAXIAL LAYER POSSESSING A LOW ALKALI-METAL CONCENTRATION AND METHOD OF CREATING THE SAME," which application is incorporated by reference herein.

This application is related to the following co-pending and commonly-assigned U.S. patent applications:

U.S. Provisional Patent Application Ser. No. 60/790,310, filed Apr. 7, 2006, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," by Tadao Hashimoto, et al.;

U.S. patent application Ser. No. 11/765,629, filed on Jun. 20, 2007, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH," now U.S. Pat. No. 7,755,172, issued on Jul. 13, 2010;

U.S. Provisional Patent Application Ser. No. 60/821,558, filed on Aug. 4, 2006, by Frederick F. Lange, Jin Hyeok Kim, Daniel B. Thompson and Steven P. DenBaars, entitled "HYDROTHERMAL SYNTHESIS OF TRANSPARENT CONDUCTING ZnO HETEROEPITAXIAL FILMS ON GaN IN WATER AT 90 C,";

U.S. Provisional Patent Application Ser. No. 60/911,213, filed on Apr. 11, 2007, by Frederick F. Lange, Jin Hyeok Kim, Daniel B. Thompson and Steven P. DenBaars, entitled "HYDROTHERMAL SYNTHESIS OF TRANSPARENT CONDUCTING ZnO HETEROEPITAXIAL FILMS ON GaN IN WATER AT 90 C,";

U.S. Provisional Patent Application Ser. No. 61/112,560, filed on Nov. 7, 2008, by Siddha Pimputkar et al., entitled "REACTOR DESIGNS FOR USE IN AMMONOTHERMAL GROWTH OF GROUP-III NITRIDE CRYSTALS,";

U.S. Provisional Patent Application Ser. No. 61/112,552, filed on Nov. 7, 2008, by Siddha Pimputkar et al., entitled "NOVEL VESSEL DESIGNS AND RELATIVE PLACEMENTS OF THE SOURCE MATERIAL AND SEED CRYSTALS WITH RESPECT TO THE VESSEL FOR THE AMMONOTHERMAL GROWTH OF GROUP-III NITRIDE CRYSTALS,";

U.S. Provisional Patent Application Ser. No. 61/112,558, filed on Nov. 7, 2008, by Siddha Pimputkar et al., entitled "ADDITION OF HYDROGEN AND/OR NITROGEN CONTAINING COMPOUNDS TO THE NITROGEN-CONTAINING SOLVENT USED DURING THE AMMONOTHERMAL GROWTH OF GROUP-III NITRIDE CRYSTALS TO OFFSET THE DECOMPOSITION OF THE NITROGEN-CONTAINING SOLVENT AND/OR MASS LOSS DUE TO DIFFUSION OF HYDROGEN OUT OF THE CLOSED VESSEL,";

U.S. Provisional Patent Application Ser. No. 61/112,545, filed on Nov. 7, 2008, by Siddha Pimputkar et al., entitled "CONTROLLING RELATIVE GROWTH RATES OF DIFFERENT EXPOSED CRYSTALLOGRAPHIC FACETS OF A GROUP-III NITRIDE CRYSTAL DURING THE AMMONOTHERMAL GROWTH OF A GROUP-III NITRIDE CRYSTAL,"; and U.S. Provisional Patent Application Ser. No. 61/112,550, filed on Nov. 7, 2008, by Siddha Pimputkar et al., entitled "USING BORON-CONTAINING COMPOUNDS, GASSES AND FLUIDS DURING AMMONOTHERMAL GROWTH OF GROUP-III NITRIDE CRYSTALS,";

all of which applications are incorporated by reference herein.

BACKGROUND OF THE INVENTION

1. Field of the Invention

This invention relates to a low impurity hexagonal würtzite type epitaxial layer, and more specifically, a low alkali-metal epitaxial layer, grown on a hexagonal würtzite substrate, and a method for creating the low impurity content hexagonal würtzite type epitaxial layer.

2. Description of the Related Art

The usefulness of gallium nitride (GaN), and its ternary and quaternary compounds incorporating aluminum and indium (AlGaN, InGaN, AlInGaN), has been well established for fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

GaN and its alloys are the most stable in the hexagonal würtzite crystal structure, in which the structure is described by two (or three) equivalent basal plane axes that are rotated 120° with respect to each other (the a-axis), all of which are perpendicular to a unique c-axis. Group III and nitrogen atoms occupy alternating c-planes along the crystal's c-axis. The symmetry elements included in the würtzite structure dictate that III-nitrides possess a bulk spontaneous polarization along this c-axis, and the würtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to reduced carrier recombination efficiency, reduced oscillator strength, and red-shifted emission.

One approach for eliminating or reducing the spontaneous and piezoelectric polarization effects in GaN optoelectronic devices is to grow the devices on non-polar or semi-polar planes of the crystal. Recently, several reports have been published which confirmed the benefit of the non-polar and semi-polar devices. Most of them indicate that a high-quality substrate is essential for fabrication of these devices. Historically, numerous foreign substrates, such as SiC, spinel, sapphire, etc., have been used to fabricate devices, however, the device quality has been poor due to the high defect density caused by heteroepitaxial growth of the devices on the foreign substrates.

Accordingly, high quality and high cost-performance GaN substrates are necessary for homo-epitaxial growth and industrialization of non-polar and semi-polar devices. One approach is to utilize HVPE GaN substrates for the production of non-polar and semi-polar devices, but the substrate wafer size is limited, and also the production cost is quite high.

Currently, there are a variety of methods being pursued for the growth of GaN single crystal substrates. In many approaches, one or more alkali-metals are needed and intentionally added into the growth system, for example, sodium and/or potassium are added for the growth of GaN in supercritical ammonia, and sodium is a key constituent in the growth of GaN by the sodium flux method. This addition of alkali-metal to the growth environment causes the grown GaN crystals to typically contain high concentrations of the alkali-metals that are used during the growth process, and this severely increases the likelihood that the alkali-metals in the substrate will diffuse into the epitaxial layers during device growth and have a negative impact on the device electrical properties and performance.

The present invention provides a hexagonal würtzite type epitaxial layer possessing a low concentration of alkali-metals. The present invention also provides a method to produce these low impurity content epitaxial films by minimizing the diffusion of the alkali-metals from the substrate into the epitaxial film by choosing a proper crystal plane of the substrate.

The term "semi-polar planes" can be used to refer to a wide variety of planes that possess two nonzero h, i, or k Miller indices; and a nonzero l Miller index. The term "non-polar planes" can be used to refer to a wide variety of planes that possess two nonzero h, i, or k Miller indices; and a zero l Miller index.

SUMMARY OF THE INVENTION

To overcome the limitations in the prior art described above, and to overcome other limitations that will become apparent upon reading and understanding the present specification, the present invention describes a hexagonal würtzite type epitaxial layer possessing a low alkali-metal concentration, and a method for creating the same.

There are several methods to manufacture large area hexagonal würtzite single crystal substrates, such as ammonothermal method, or Na-flux method, etc. In some of these methods, alkali-metals are essential and intentionally used in the growth process. On the other hand, alkali-metals are undesirable in devices grown on substrates produced using these methods, since alkali-metals can have an adverse affect on the electrical properties of the devices. However, the present invention has confirmed that the concentration of alkali-metals in device layers can be minimized, which is beneficial to both device manufacturers and substrate manufacturers.

The present invention discloses an epitaxial layer containing a low alkali-metal concentration and a method for minimizing the alkali-metal incorporation in the epitaxial layer. The present invention has found that the diffusion of alkali-metals into the epitaxial layer from the substrate strongly depends on the crystal plane of the surface of the substrate.

The present invention comprises methods, layers, devices, and apparatuses for making a hexagonal würtzite type epitaxial layer having a low impurity concentration of alkali-metal. A method in accordance with one or more embodiments of the present invention comprises using a hexagonal würtzite substrate possessing a relatively higher impurity concentration of alkali-metal, and growing the hexagonal würtzite epitaxial layer on a surface of the hexagonal würtzite substrate, wherein the surface has a crystal plane different from a c-plane.

Such a method further optionally comprises the crystal plane being an m-plane, an a-plane, any one of the off-oriented planes between m-plane and a-plane, an m-plane, a-plane or any one of the off-oriented planes between m-plane and a-plane with one or more off-orientations along a <11-20>, a [0001], a [000-1], and/or a <1-100> direction, a semi-polar plane, the hexagonal würtzite type epitaxial layer containing Gallium (Ga), the hexagonal würtzite type epitaxial layer being a III-nitride layer, the hexagonal würtzite substrate of the epitaxial layer containing at least one alkali-metal, the hexagonal würtzite type epitaxial layer containing a reduced concentration of alkali-metal as compared to the hexagonal würtzite substrate, the hexagonal würtzite type epitaxial layer possessing an alkali-metal concentration for each present alkali-metal of less than $10^{16}$ atoms/cm$^3$, a device or epitaxial film using the hexagonal würtzite epitaxial layer produced by the method of claim 1, the hexagonal würtzite type epitaxial layer being grown by molecular beam epitaxy (MBE), metalorganic chemical vapor deposition (MOCVD), or hydride vapor phase epitaxy (HVPE), the hexagonal würtzite substrate being produced by the ammonothermal method, and the crystal plane of the hexagonal würtzite substrate being selected to control the impurity concentration of an alkali-metal in the hexagonal würtzite type epitaxial layer.

A hexagonal würtzite type epitaxial layer grown on a hexagonal würtzite substrate in accordance with one or more embodiments of the present invention comprises an impurity concentration of an alkali-metal in the hexagonal würtzite type layer that is less than an impurity concentration of the alkali-metal in the hexagonal würtzite substrate, and wherein the hexagonal würtzite type epitaxial layer is grown on a surface of the hexagonal würtzite substrate having a crystal plane that is different from a c-plane.

Such a hexagonal würtzite type epitaxial layer further optionally comprises the hexagonal würtzite substrate surface having a crystal plane that is an m-plane, a-plane, any one of the off-oriented planes between m-plane and a-plane, a semi-polar plane, or an m-plane, a-plane or any one of the off-oriented planes between m-plane and a-plane with one or more off-orientations along a <11-20>, a [0001], a [000-1], and/or a <1-100> direction, the hexagonal würtzite type epitaxial layer containing Gallium (Ga), the hexagonal würtzite type epitaxial layer being a III-Nitride layer, the substrate containing at least one alkali-metal, the hexagonal würtzite type epitaxial layer containing a reduced concentration of alkali-metals as compared to the substrate, the hexagonal würtzite type epitaxial layer possessing an alkali-metal concentration for each present alkali-metal of less than $10^{16}$ atoms/cm$^3$, a device using the epitaxial layer, the hexagonal würtzite type epitaxial layer being grown by molecular beam epitaxy (MBE), metalorganic chemical vapor deposition (MOCVD), or hydride vapor phase epitaxy HVPE), the substrate of the epitaxial layer being produced by the ammonothermal method, and the crystal plane of the hexagonal würtzite substrate being selected to control the impurity concentration of alkali-metal in the hexagonal würtzite type epitaxial layer.

A hexagonal würtzite type epitaxial layer grown on a hexagonal würtzite substrate in accordance with one or more embodiments of the present invention comprises a concentration of alkali-metal, wherein an epitaxial layer having a c-plane orientation has a lower alkali-metal concentration than an epitaxial layer having an orientation other than the c-plane orientation.

A method of obtaining a hexagonal würtzite type epitaxial layer with a comparatively low impurity concentration of alkali-metal on a hexagonal würtzite substrate possessing a comparatively high impurity concentration of the alkali-metal in accordance with one or more embodiments of the present invention comprises growing the hexagonal würtzite type epitaxial layer upon a surface of the substrate having a crystal plane orientation other than a c-plane orientation.

Such a method further optionally comprises the crystal plane orientation being a non-polar orientation or a semi-polar orientation, the hexagonal würtzite type epitaxial layer being a III-nitride layer, the substrate being produced by an ammonothermal method, the hexagonal würtzite type epitaxial layer being grown by molecular beam epitaxy (MBE), metalorganic chemical vapor deposition (MOCVD), or hydride vapor phase epitaxy (HVPE), an epitaxial layer fabricated using the method, and a device including the epitaxial layer.

A hexagonal würtzite type epitaxial layer in accordance with one or more embodiments of the present invention possesses a comparatively low impurity concentration of alkali-metal grown on a hexagonal würtzite substrate possessing a comparatively high impurity concentration of alkali-metal, wherein the hexagonal würtzite type epitaxial layer is grown upon a surface of the hexagonal würtzite substrate having a crystal plane orientation other than a c-plane orientation.

Such a layer further optionally comprises the crystal plane orientation being a non-polar orientation or a semi-polar orientation, the hexagonal würtzite type epitaxial layer being a III-nitride layer, the substrate is produced by an ammonothermal method, the hexagonal würtzite type epitaxial layer being grown by molecular beam epitaxy (MBE), metalorganic chemical vapor deposition (MOCVD), or hydride vapor phase epitaxy (HVPE), and a device including the epitaxial layer.

A method of growing a hexagonal würtzite type epitaxial layer having a first impurity concentration of alkali-metal in accordance with one or more embodiments of the present invention comprises growing the hexagonal würtzite type epitaxial layer on a hexagonal würtzite substrate having a second impurity concentration of alkali-metal higher than the first impurity concentration of alkali-metal, and selecting a growth surface of the hexagonal würtzite substrate for growing the hexagonal würtzite type epitaxial layer to control the first impurity concentration of alkali-metal.

The present invention has used c-plane and m-plane GaN substrates, both of which contain similar levels of alkali-metal ($3 \times 10^{18}$ atoms/cm$^3$), as substrates for the growth of GaN buffer layers and light emitting diode (LED) device structures by conventional MOCVD. Although the active layer growth conditions were optimized for both planes, the GaN buffer layer (the first layer grown on the substrate) growth conditions were quite similar for both planes. The growth temperature of the buffer layer was approximately 1100° C. for both the c-plane and m-plane buffer layers. After growth, the present invention was able to make a clear comparison of the alkali-metal diffusion that occurred from the substrate into the epitaxial film during the MOCVD growth for each substrate plane. Comparison is possible since sodium (the alkali-metal) is never used in the MOCVD growth system, so the sodium concentrations that were observed in the epitaxial layers are recognized to be the result of diffusion of the alkali-metals from the substrates into the epitaxial films. A Secondary Ion Mass Spectrometry (SIMS) impurity analysis was performed on each wafer to determine the concentration of alkali-metals. The sodium concentration in the m-plane epitaxial layer was $4 \times 10^{14}$ atoms/cm$^3$, nearly 4 orders of magnitude lower than in the substrate. On the other hand, the c-plane epitaxial layer contained a sodium concentration of $8 \times 10^{16}$ atoms/cm$^3$, which is more than 2 orders of magnitude higher than in the m-plane epitaxial layer. This provides an example for the present invention that by choosing proper growth planes, diffusion of impurities from the substrate into the epitaxial layer can be minimized.

BRIEF DESCRIPTION OF THE DRAWINGS

Referring now to the drawings in which like reference numbers represent corresponding parts throughout.

DETAILED DESCRIPTION OF THE INVENTION

Figure 1A:
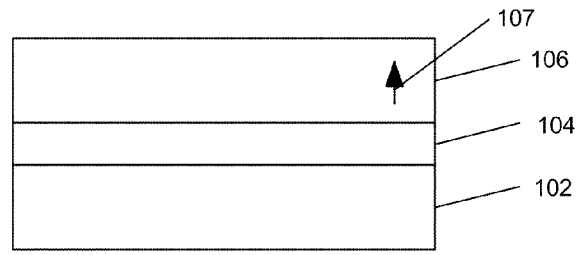
FIGS. 1A-1D illustrate the growth of a hexagonal würtzite substrate.
Figure 1B:
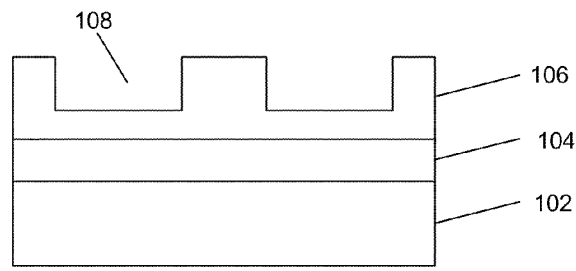
Figure 1C:
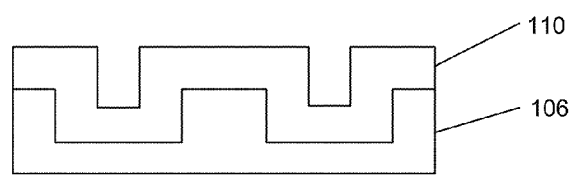

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

OVERVIEW

The present invention provides a low impurity hexagonal würtzite type epitaxial layer, and more specifically, a low alkali-metal epitaxial layer, grown on a hexagonal würtzite substrate. The present invention also describes a technique for minimizing the alkali-metal incorporation into the epitaxial layer.

A method for growing III-nitride crystals in supercritical ammonia has been proposed and demonstrated. This method is expected to produce bow-free GaN substrates containing low structural defect densities in a cost-effective manner. One potential drawback of this approach, however, is that alkali-metals (for example, sodium (Na), potassium (K), lithium (Li), etc.) are intentionally used in the growth system in the basic ammonothermal process. This presents a serious risk that the alkali-metal that is unintentionally incorporated into the GaN substrate during substrate growth will diffuse into the epitaxial layers during epitaxial growth, resulting in a deterioration of the electrical properties of the epitaxial layer.

The present invention has found that the diffusion of the alkali-metals into the epitaxial layer strongly depends on the crystal plane of the substrate, and therefore, can be effectively suppressed.

TECHNICAL DESCRIPTION

The present invention provides a hexagonal würtzite type epitaxial layer containing a low alkali-metal concentration. The present invention also comprises a method for minimizing alkali-metal incorporation in epitaxial layers. In particular, the present invention utilizes the directional dependence of alkali-metal diffusion within GaN crystals. It is important to choose proper growth planes to minimize alkali-metal incorporation into epitaxial layers.

FIGS. 1A-1D illustrate the growth of a würtzite substrate.

Typically, a substrate 102 and a buffer layer 104 are provided as an atomic template for würtzite layer 106. Substrate 102 is typically sapphire, silicon carbide, or other materials, and buffer layer 104 is typically used to allow the würtzite layer 106 a proper lattice match to begin growth. Würtzite layer 106 typically grows in a c-plane direction 107, wherein the c-plane surface 108 is opposite that of buffer layer 104. Buffer layer 104 and würtzite layer 106 are typically grown using MOCVD, HVPE, MBE, or other epitaxial growth techniques.

Würtzite layer 106 is then optionally processed, either through photolithography or other etching techniques, to create a surface 108 on würtzite layer 106 which will facilitate lateral overgrowth of subsequent layers. Although described as a layer 106, similar processing can be done on a würtzite seed crystal 106 to facilitate lateral overgrowth of subsequent layers. Where seed crystals 106 are used directly, substrate 102 and buffer layer 104 are typically not necessary, however, to facilitate lateral overgrowth of subsequent layers. As such, substrate 102 and buffer layer 104 are not shown in FIGS. 1C-1D, however, it is to be understood that buffer layer 104 and substrate 102 can also be present in these figures if such a substrate 102 is used to begin growth.

Alternatively, the würtzite layer 106 is optionally not processed and subsequent growth occurs on an essentially flat surface 108. This method, however, does not utilize lateral epitaxial overgrowth, Layer 110 is then grown on surface 108 of würtzite layer 106$_{[MSOffice1]}$. Layer 110 is typically grown using the ammonothermal growth method, or other solvo-thermal methods such as the sodium flux method. Solvo-thermal methods often require the use alkali metals in the process. In the basic ammonothermal process, alkali metals are used in the form of mineralizers, e.g., sodium, sodium amide, or potassium amide, to increase solubility of GaN in ammonia.

As such, solvo-thermal methods of growth introduce the possibility of unwanted impurities into layer 110. Typically, impurities, called dopants, are intentionally introduced into layer 110 to create properties of layer 110 that are known and controllable. However, unwanted impurities, especially alkali-metal impurities, degrade the electrical properties of layer 110, because such impurities reduce the controllability, a priori knowledge, and electrical and mechanical stability of layer 110. Although the related art [1] indicates that alkali-metal content of 500 ppm in layer 110 is acceptable, with many devices such concentrations would render the devices inefficient, non-operational, or reduce the lifetime.

Figure 1D:
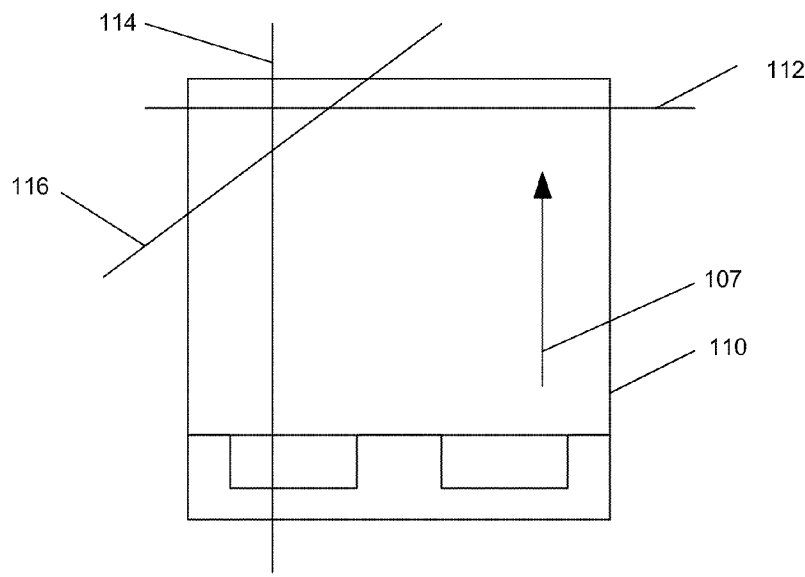

FIG. 1D illustrates a thick würtzite layer 110, thick enough to be sliced into wafers that can be used as substrates. If a c-plane growth surface is desired for growth of epitaxial layers, cleave plane 112 would be used, and würtzite layer 110 would be sliced using cuts essentially parallel to cleave plane 112. These cuts would generate wafers from würtzite layer 110, which would then be further processed as necessary to accept epitaxial layers in the c-plane growth direction.

Should an a-plane or m-plane growth surface be desired, würtzite layer 110 would be sliced using vertical cuts perpendicular to cleave plane 112, for example parallel to cleave plane 114. If semi-polar plane growth surfaces are desired, würtzite layer 110 would be sliced along a plane between cleave plane 112 and cleave plane 114, for example, using cuts parallel to cleave plane 116. Other cleave planes could also be used to generate growth surfaces in other desired planes. Again, these cuts would generate wafers from würtzite layer 110, which would then be further processed as necessary to accept epitaxial layers in the desired planar growth direction. Although the term "cleave plane" is used to identify items 112, 114, and 116, this term is simply used to define that separation of würtzite layer 110 is occurring along that specific plane or location. The term "cleave plane" is not intended to indicate that the würtzite layer 110 is separated by cleaving, although it could be separated by cleaving, etching, dicing, sawing, laser scribing, diamond scribing, a combination thereof, or a different separating process.

FIGS. 2A-2D illustrate an alternate method for growth of a würtzite epitaxial layer in accordance with one or more embodiments of the present invention.

Figure 2A:
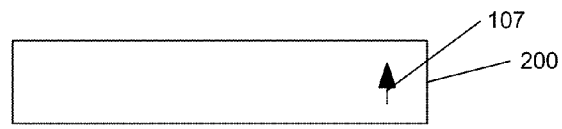
FIG. 2A-2D illustrate the growth of the substrate and the epitaxial layer in accordance with one or more embodiments of the present invention.

FIG. 2A shows a würtzite seed crystal 200. Unlike the alterations made to layer 106 of FIG. 1B, würtzite seed crystal 200 is not modified to create lateral overgrowth.

Figure 2B:
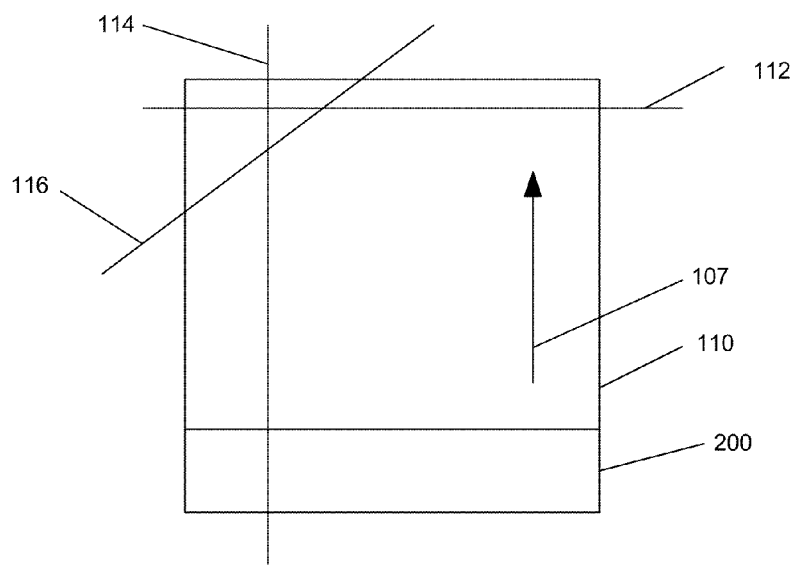

Würtzite layer 110 is grown, via a solvo-thermal method, which is typically an ammonothermal method, directly onto würtzite seed crystal 200 as shown in FIG. 2B. Again, a thick würtzite layer 110 is grown, in one embodiment in the c-plane direction, thick enough to be sliced into wafers that can be used as substrates. If a final c-plane growth surface is desired for growth of epitaxial layers, cleave plane 112 would be used, and würtzite layer 110 would be sliced using cuts essentially parallel to cleave plane 112. These cuts would generate wafers from würtzite layer 110, which would then be further processed as necessary to accept epitaxial layers in the c-plane growth direction.

Figure 2C:
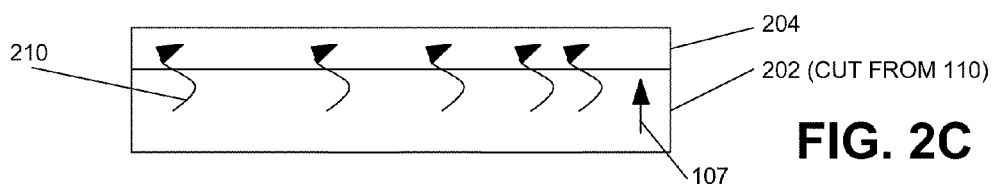
Figure 2D:
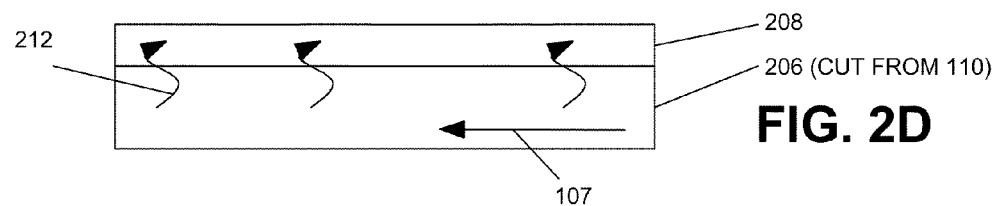

Should an a-plane or m-plane growth surface be desired, würtzite layer 110 would be sliced using vertical cuts perpendicular to cleave plane 112, for example parallel to cleave plane 114. If semi-polar plane growth surfaces are desired, würtzite layer 110 would be sliced along a plane between cleave plane 112 and cleave plane 114, for example, using cuts parallel to cleave plane 116. Other cleave planes could also be used to generate growth surfaces in other desired planes. Again, these cuts would generate wafers from würtzite layer 110, which would then be further processed as necessary to accept epitaxial layers in the desired planar growth direction. FIG. 2C illustrates a portion of layer 110, namely substrate 202, which has been cut from layer 110 with a c-plane surface orientation, such that epitaxial layer 202 is grown on a c-plane of substrate 202. FIG. 2D illustrates a portion of layer 110, namely substrate 206, which has been cut from layer 110 with a m-plane orientation, such that epitaxial layer 208 is grown on a m-plane of substrate 206. Other planes of growth for the epitaxial layers 204 and 208 are possible within the scope of the present invention by changing the cleave plane of layer 110.

As epitaxial layers 204 and 208 are grown, impurities present in würtzite substrates 202 and 206 migrate from substrates 202 and 206 to epitaxial layers 204 and 208, respectively, as shown by migration paths 210 and 212. For some devices made in or from epitaxial layers 204 and 208, and any subsequent epitaxial or otherwise grown layers on epitaxial layers 204 and 208, the concentration of impurities that migrate from substrates 202 and 206 to epitaxial layers 204 and 208 may be important; for other devices, the concentration may be irrelevant. The present invention allows for the selection of a plane of the würtzite substrates 202 and 206 to be based on the migration, or lack of migration, of these impurities. The migration is likely due to the grain structure of the material. There are grains that typically run along the c-direction (when nucleating on c-plane seeds), and the boundaries between these grains have structural defects that serve as diffusion pathways for the alkali metals. The process is typically referred to as pipe diffusion. So the diffusion could also be minimized by reducing or eliminating the formation of these grains.

In the present invention, GaN substrates 202 and 206 were prepared by growing bulk GaN crystals 110 by the ammonothermal method using supercritical ammonia with a sodium amide mineralizer. A 1 inch inner diameter autoclave was used which is made of a Ni—Cr super alloy. GaN seed crystals 200 were loaded into the autoclave at the higher temperature zone (growth region), a baffle plate was set in the middle of the autoclave, and polycrystalline GaN crystals contained in a Ni—Cr mesh basket were placed in the lower temperature zone (nutrient region) of the autoclave. The nutrient polycrystalline GaN was synthesized by the HVPE method. Next, the mineralizer, sodium amide in this case, was added to the vessel. Other mineralizers could also be used according to the present invention. The vessel was subsequently closed. The preceding loading processes were all performed inside a nitrogen glove box to avoid oxygen and water contamination.

After closing the vessel, the vessel was cooled down using liquid nitrogen. Ammonia was then added into the vessel through a specialized port containing a high pressure valve. The amount of ammonia was monitored by a flow meter, and the high pressure valve was closed after the necessary amount of ammonia was condensed inside the vessel. The amount of ammonia was strictly controlled so as to obtain the necessary pressure at the growth temperature, in this case ~200 MPa at 500~600° C. After filling the autoclave with ammonia, the vessel was set within the resistive heating system. The heating system contains two separate zones, a lower zone and an upper zone, which correspond to the growth region and nutrient region, respectively.

The nutrient zone temperature was maintained at 500~550° C., and the growth zone temperature was maintained at 550~600° C. This temperature gradient produced a solubility difference between the two regions, and also enhanced the convection inside the vessel for nutrient transfer. Together, these resulted in GaN crystal 110 growth on the seed crystals 200. GaN crystal 110 was grown to approximately 6 mm tall and a lateral dimension of roughly 5 mm. After growth, two GaN bulk crystals 202 and 206 were cut and polished to prepare c-plane and m-plane GaN wafers 202 and 206, where the thickness of GaN wafers 202 and 206 were approximately 350 microns each. LED structures, e.g., epitaxial layers 204 and 208, were subsequently grown on these prepared substrates 202 and 206 by conventional MOCVD, with the LED structure grown on a GaN buffer layer which is one of the layers in epitaxial layers 204 and 208). The GaN buffer layers grown on the c-plane and m-plane substrates were produced with similar growth conditions and a growth temperature of approximately 1100° C.

After epitaxial film 204 and 208 growth, a SIMS impurity analysis was performed on each wafer, e.g. on epitaxial films 204 and 208, to determine the concentration of alkali-metals in both the substrates 202 and 206 and the epitaxial films 204 and 208.

Since alkali-metals, e.g., sodium and/or potassium, were only used in the process of making würtzite layer 110, i.e., through the use of a sodium amide mineralizer, any alkali-metal impurities that are present in the epitaxial layers 204 and 208 must be present because of migration of these impurities, via paths 210 and 212, from substrates 202 and 206 to epitaxial layers 204 and 208.

Analysis of the alkali-metal concentrations in substrates 202 and 206 to epitaxial layers 204 and 208 showed that the sodium concentration in the m-plane epitaxial layer 208 was $4 \times 10^{14}$ atoms/cm$^3$, nearly 4 orders of magnitude lower than in the GaN substrate 206. On the other hand, the c-plane epitaxial layer 204 contained a sodium concentration of $8 \times 10^{16}$ atoms/cm$^3$, which is more than 2 orders of magnitude higher than in the m-plane epitaxial layer 208. Accordingly, the present invention has determined that hexagonal würtzite type epitaxial layers 204 and 208 can have their impurity properties determined prior to the growth of epitaxial layers 204 and 208, and this determination is made by selecting the proper cleave plane 112, 114, 116, or cleave plane between cleave plane 112 and cleave plane 114. Such selections allow you to control and minimize the impurity incorporation into the device. Many devices will require epitaxial layers 208 that are preferentially grown on a hexagonal würtzite substrate 206 where the surface of the substrate has a crystal plane that is perpendicular to the c-plane (e.g., the m-plane) to reduce impurity incorporation within the epitaxial film. Additionally, other crystallographic planes may have low impurity diffusion coefficients or high impurity diffusion coefficients. As such, the growth plane for a given substrate 202 or 206 can be selected to produce a substrate with a desired impurity incorporation. Semipolar planes likely have a diffusion rates in between nonpolar and c-plane since the defects still run through the wafers but must travel a longer distance to reach the surface.

EXPERIMENTAL RESULTS

The present invention used c-plane and m-plane GaN substrates 202 and 206, both of which contain similar levels of alkali-metal ($3 \times 10^{18}$ atoms/cm$^3$), as substrates for the growth of GaN buffer layers 204 and 208, and light emitting diode (LED) device structures, by conventional MOCVD. Although the active layer growth conditions were optimized for both planes, the GaN buffer layers' 204 and 208 (the first layer grown on the substrates 202 and 206) growth conditions were quite similar for both planes. The growth temperature of the buffer layers 204 and 208 was approximately 1100° C. for both the c-plane and m-plane buffer layers 204 and 208, respectively.

After growth of layers 204 and 208, the present invention was able to make a clear comparison of the alkali-metal diffusion that occurred from the substrates 202 and 206 into the epitaxial films 204 and 208 during the MOCVD growth for each substrate plane. Comparison is possible since sodium (the alkali-metal) is never used in the MOCVD growth system, so the sodium concentrations that were observed in the epitaxial layers 204 and 208 are recognized to be the result of diffusion of the alkali-metals from the substrates 202 and 206 into the epitaxial films 204 and 208 via diffusion paths 210 and 212.

Figure 3:
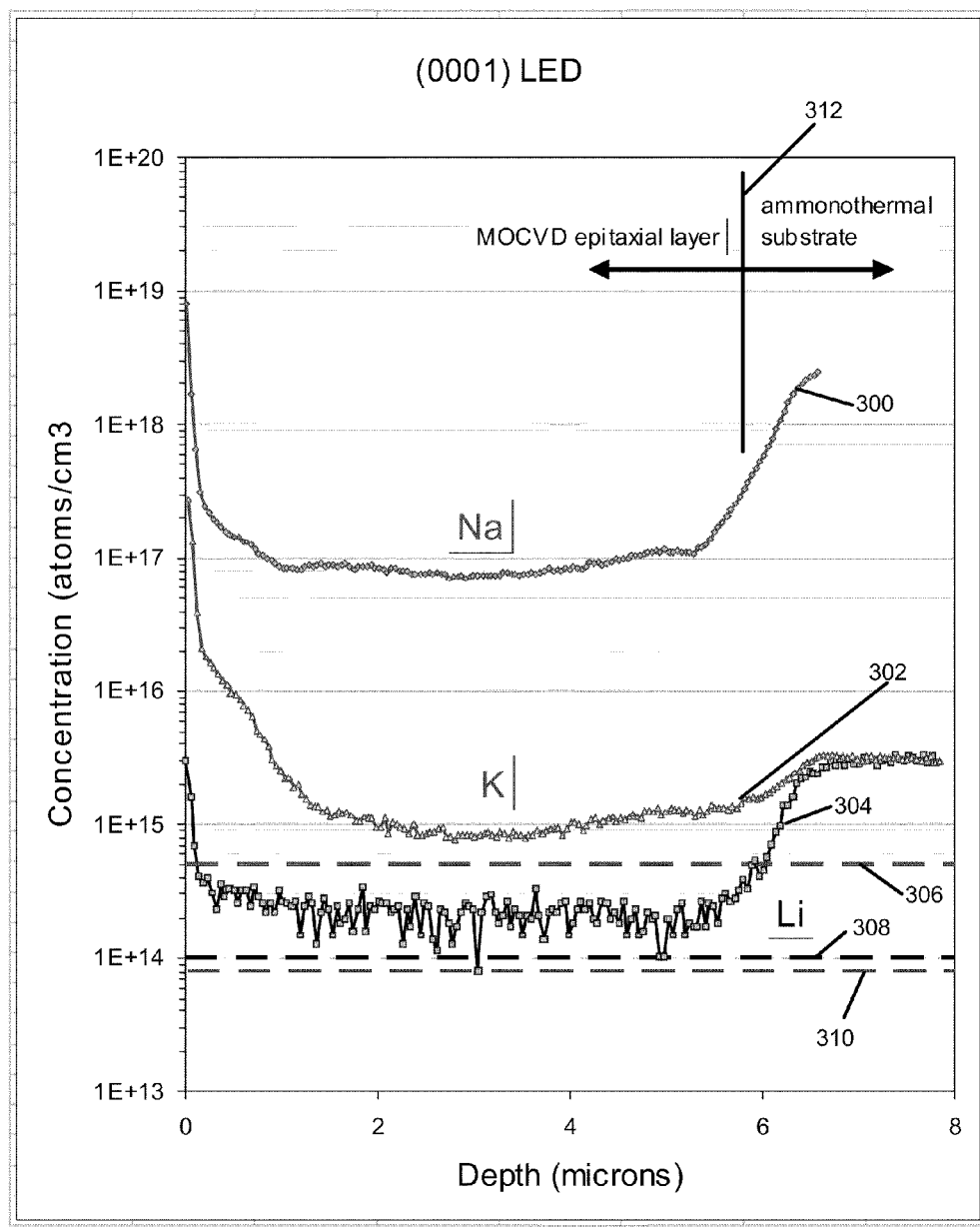
FIG. 3 shows the SIMS depth profile for a c-plane epitaxial layer and alkali-metal containing substrate.
Figure 4:
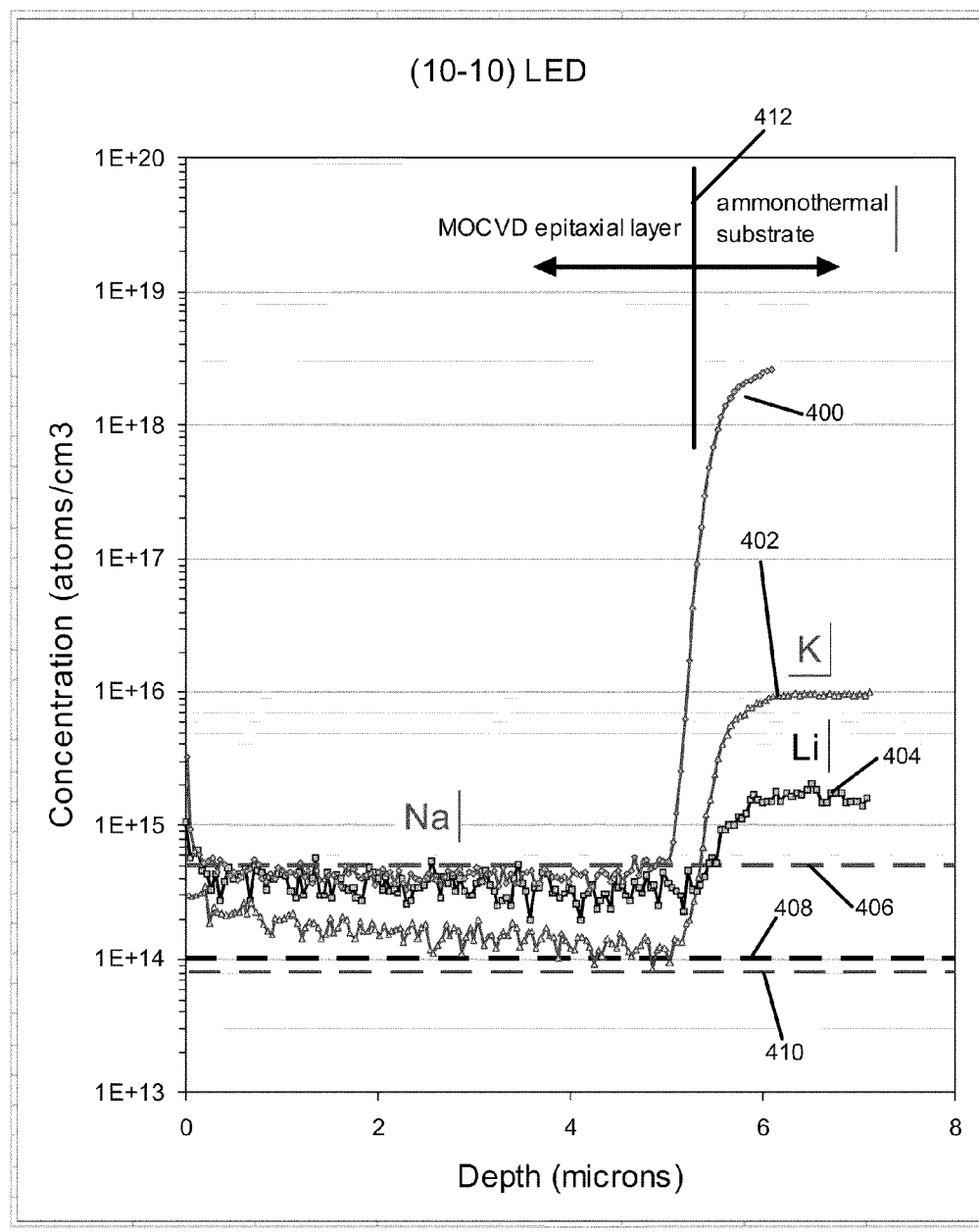
FIG. 4 shows the SIMS depth profile for a m-plane epitaxial layer and alkali-metal containing substrate.

A SIMS impurity analysis was performed on each wafer to determine the concentration of alkali-metals. FIG. 3 shows the SIMS depth profile for the c-plane epitaxial layer 204 and alkali-metal containing substrate 202, and FIG. 4 shows the SIMS depth profile for the m-plane epitaxial layer 208 and alkali-metal containing substrate 206. In both FIGS. 3 and 4, the concentration of alkali-metals is displayed as a function of depth into the films 204 and 208 and substrates 202 and 206.

In FIG. 3, the sodium concentration 300, potassium concentration 302, and lithium concentration 304 are shown. The sodium concentration 300, potassium concentration 302, and lithium concentration 304 all have measurement limits, which are shown as the sodium concentration limit 306, potassium concentration limit 308, and lithium concentration limit 310, respectively. The interface 312 between the epitaxial layer 204 and substrate 202 is also indicated.

In FIG. 4, the sodium concentration 400, potassium concentration 402, and lithium concentration 404 are shown. The sodium concentration 400, potassium concentration 402, and lithium concentration 404 all have measurement limits, which are shown as the sodium concentration limit 406, potassium concentration limit 408, and lithium concentration limit 410, respectively. The interface 412 between the epitaxial layer 208 and substrate 206 is also indicated.

The SIMS analysis clearly indicates that the diffusion of the alkali-metal from the substrates 202 and 206 into the epitaxial layers 204 and 208 is strongly reduced for the m-plane substrate 206 as compared to the c-plane substrate 202. This difference is particularly visible for the alkali-metal sodium.

The initial sodium concentration in both the m-plane and c-plane substrates 202 and 206 was essentially the same, $3 \times 10^{18}$ atoms/cm$^3$. After epitaxial film 204 and 208 growth, however, the sodium concentration in the m-plane epitaxial layer 208 was $4 \times 10^{14}$ atoms/cm$^3$, nearly 4 orders of magnitude lower than in the substrate 206. On the other hand, the c-plane epitaxial layer 204 contained a sodium concentration of $8 \times 10^{16}$ atoms/cm$^3$, which indicates that a substantial amount of sodium diffusion is occurring along the c-direction from substrate 202. Moreover, the final sodium concentration in the c-plane epitaxial film 204 is more than 2 orders of magnitude higher than in the m-plane epitaxial film 208. Furthermore, another alkali-metal, potassium, demonstrates the same behavior with substantially less diffusion along the m-direction.

As such, for devices where diffusion of alkali-metals, or other impurities present in the GaN substrates 202 and 206 is critical, the growth surface, or the crystal plane of the GaN substrates 202 and 206, can be selected to control the diffusion of these impurities into the layers 204 and 208, as well as subsequent layers that are grown on layers 204 and 208.

Possible Modifications and Variations

The preferred embodiment has described one example of a low impurity content GaN film grown on an m-plane GaN substrate containing alkali-metals. Although GaN growth on the alkali-metal containing GaN substrate was described, the present invention is suitable for the growth of all III-nitride crystals and epitaxial layers, including AlN, GaN, InN, and their alloys, such as AlInN and AlGaN. Additionally, the epitaxial films may contain other elements from any group of the periodic table of the elements. For example, doping elements may be incorporated into the growing films, including but not limited to silicon (Si) and magnesium (Mg).

The present invention may use any alkali-metal containing or impurity containing hexagonal würtzite substrate, including but not limited to AlN, GaN, InN, ZnO, and their alloys.

Although epitaxial film growth was demonstrated by MOCVD, other epitaxial growth techniques can be used, such as MBE and HVPE, to grow the epitaxial film.

The present invention has experimentally demonstrated that the diffusion of alkali-metals is reduced as the crystal plane of growth varies away from the c-plane (e.g., along or towards the m-direction). Consequently, epitaxial m-plane layers can be achieved with low alkali-metal concentrations on m-plane substrates. Although this was experimentally demonstrated for the m-plane, the present invention dictates that any nonpolar plane may utilized according to the present invention, including m-plane, a-plane, and any one of the off-oriented planes between the m-plane and a-plane. Furthermore, these planes can be off-oriented along any direction or directions, including the <11-20>, [0001], [000-1], and/or <1-100> directions. Additionally, all planes perpendicular or nearly perpendicular to the c-plane are suitable as substrates for the present invention since it has been determined that the primary diffusion path of alkali-metals and other impurity elements is along the c-direction. Accordingly, any substrates which have a surface which is not a c-plane will have reduced impurity diffusion. Included within this set are all semi-polar planes, which are also a suitable substrate according to the present invention.

Although the present invention has focused on alkali-metals, the diffusion of other impurity elements and subsequent incorporation into the epitaxial films can also be minimized by using the substrates and methods described in the present invention.

Although the present invention has focused on alkali-metals which are typically used in basic ammonothermal processing, the ideas and concepts in this invention could be applied to other elements, such as mineralizers used in acidic ammonothermal processing. These mineralizers could contain halide elements, including fluorine, chlorine, bromine, iodine, and astatine, along with their associated ions.

The present invention may be used to produce epitaxial layers that are constituents within devices.

ADVANTAGES AND IMPROVEMENTS

There are a variety of methods being pursued for the growth of hexagonal würtzite single crystals which are to be used as substrates for epitaxial growth. Some of these approaches are in the research and development phase while others have already been industrialized. In most approaches, one or more alkali-metals are needed and intentionally added into the growth system, for example, sodium and/or potassium are added for the growth of GaN in supercritical ammonia, lithium and/or potassium are added for the hydrothermal growth of ZnO, and sodium is a key constituent in the growth of GaN by the sodium flux method. This addition of alkali-metal into the growth environment causes the grown hexagonal crystals to typically contain high concentrations of the alkali-metals that are used during the growth process, and this severely increases the likelihood that the alkali-metals in the substrate will diffuse into the epitaxial layers during device growth and have a negative impact on the device electrical properties and performance.

The present invention has found that the diffusion of the alkali-metals into the epitaxial layer strongly depends on the crystal plane of the substrate, and therefore, can be effectively suppressed by utilizing non-polar and semi-polar oriented substrates. These substrates enable epitaxial devices to be grown on the substrates with reduced impurity incorporation, particularly for alkali-metals, since the impurity elements do not strongly diffuse along the non-polar and semi-polar directions as compared to the c-direction. This enables high-quality devices to be produced with high reliability.

REFERENCES

The following reference is incorporated by reference herein:

1. United States Patent Application Publication No. 2007/0040240A1, published Feb. 22, 2007, by Dwilinski et al., entitled "Bulk nitride mono-crystal including substrate for epitaxy," which publication is based on U.S. patent application Ser. No. 11/589,058, filed Oct. 30, 2006.

CONCLUSION

The present invention comprises methods, layers, devices, and apparatuses for making a hexagonal würtzite type epitaxial layer having a low impurity concentration of alkali-metal. A method in accordance with one or more embodiments of the present invention comprises using a hexagonal würtzite substrate possessing a higher impurity concentration of alkali-metal, and growing the hexagonal würtzite epitaxial layer on a surface of the hexagonal würtzite substrate, wherein the surface has a crystal plane different from a c-plane.

Such a method further optionally comprises the crystal plane being an m-plane, an a-plane, any one of an off-oriented planes between the m-plane and the a-plane, a semi-polar plane, or an m-plane, a-plane or any one of the off-oriented planes between m-plane and a-plane with one or more off-orientations along a <11-20>, a [0001], a [000-1], and/or a <1-100> direction, the hexagonal würtzite type epitaxial layer containing Gallium (Ga), the hexagonal würtzite type epitaxial layer being a III-nitride layer, the hexagonal würtzite substrate of the epitaxial layer containing at least one alkali-metal, the hexagonal würtzite type epitaxial layer contains a reduced concentration of alkali-metal as compared to the hexagonal würtzite substrate, the hexagonal würtzite type epitaxial layer possessing an alkali-metal concentration for each present alkali-metal of less than $10^{16}$ atoms/cm$^3$, a device or epitaxial film using the hexagonal würtzite epitaxial layer, the hexagonal würtzite type epitaxial layer being grown by molecular beam epitaxy (MBE), metalorganic chemical vapor deposition (MOCVD), or hydride vapor phase epitaxy (HVPE), the hexagonal würtzite substrate being produced by the ammonothermal method, and the crystal plane of the hexagonal würtzite substrate beings selected to control the impurity concentration of alkali-metal in the hexagonal würtzite type epitaxial layer.

A hexagonal würtzite type epitaxial layer grown on a hexagonal würtzite substrate in accordance with one or more embodiments of the present invention comprises an impurity concentration of an alkali-metal in the hexagonal würtzite type layer is less than an impurity concentration of the alkali-metal in the hexagonal würtzite substrate, and wherein the hexagonal würtzite type epitaxial layer is grown on a surface of the hexagonal würtzite substrate having a crystal plane that is different from a c-plane.

Such a hexagonal würtzite type epitaxial layer further optionally comprises the hexagonal würtzite substrate surface having a crystal plane that is an m-plane, a-plane, any one of the off-oriented planes between the m-plane and a-plane, an m-plane, a-plane or any one of the off-oriented planes between m-plane and a-plane with one or more off-orientations along a <11-20>, a [0001], a [000-1], and/or a <1-100> direction, a semi-polar plane, the hexagonal würtzite type epitaxial layer containing Gallium (Ga), the hexagonal würtzite type epitaxial layer being a III-Nitride layer, the substrate containing at least one alkali-metal, the hexagonal würtzite type epitaxial layer containing a reduced concentration of alkali-metals as compared to the substrate, the hexagonal würtzite type epitaxial layer possessing an alkali-metal concentration for each present alkali-metal of less than $10^{16}$ atoms/cm$^3$, a device using the epitaxial layer, the hexagonal würtzite type epitaxial layer being grown by molecular beam epitaxy (MBE), metalorganic chemical vapor deposition (MOCVD), or hydride vapor phase epitaxy (HVPE), the substrate of the epitaxial layer being produced by the ammonothermal method, and the crystal plane of the hexagonal würtzite substrate being selected to control the impurity concentration of alkali-metal in the hexagonal würtzite type epitaxial layer.

A hexagonal würtzite type epitaxial layer grown on a hexagonal würtzite substrate in accordance with one or more embodiments of the present invention comprises a concentration of alkali-metal, wherein an epitaxial layer having a c-plane orientation has a higher alkali-metal concentration than an epitaxial layer having an orientation other than the c-plane orientation.

A method of obtaining a hexagonal würtzite type epitaxial layer with a comparatively low impurity concentration of alkali-metal on a hexagonal würtzite substrate possessing a comparatively high impurity concentration of the alkali-metal in accordance with one or more embodiments of the present invention comprises growing the hexagonal würtzite type epitaxial layer upon a surface of the substrate having a crystal plane orientation other than a c-plane orientation.

Such a method further optionally comprises the crystal plane orientation being a non-polar orientation or a semi-polar orientation, the hexagonal würtzite type epitaxial layer being a III-nitride layer, the substrate being produced by an ammonothermal method, the hexagonal würtzite type epitaxial layer being grown by molecular beam epitaxy (MBE), metalorganic chemical vapor deposition (MOCVD), or hydride vapor phase epitaxy (HVPE), an epitaxial layer fabricated using the method, and a device including the epitaxial layer.

A hexagonal würtzite type epitaxial layer in accordance with one or more embodiments of the present invention possesses a comparatively low impurity concentration of alkali-metal grown on a hexagonal würtzite substrate possessing a comparatively high impurity concentration of alkali-metal, wherein the hexagonal würtzite type epitaxial layer is grown upon a surface of the hexagonal würtzite substrate having a crystal plane orientation other than a c-plane orientation.

Such a layer further optionally comprises the crystal plane orientation being a non-polar orientation or a semi-polar orientation, the hexagonal würtzite type epitaxial layer being a III-nitride layer, the substrate is produced by an ammonothermal method, the hexagonal würtzite type epitaxial layer being grown by molecular beam epitaxy (MBE), metalorganic chemical vapor deposition (MOCVD), or hydride vapor phase epitaxy (HVPE), and a device including the epitaxial layer.

A method of growing a hexagonal würtzite type epitaxial layer having a first impurity concentration of alkali-metal in accordance with one or more embodiments of the present invention comprises growing the hexagonal würtzite type epitaxial layer on a hexagonal würtzite substrate having a second impurity concentration of alkali-metal higher than the first impurity concentration of alkali-metal, and selecting a growth surface of the hexagonal würtzite substrate for growing the hexagonal würtzite type epitaxial layer to control the first impurity concentration of alkali-metal.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the appended claims.

What is claimed is:

1. A method of obtaining a hexagonal würtzite type epitaxial layer having a desired impurity concentration of alkali-metal, comprising:
   using a hexagonal würtzite substrate possessing an impurity concentration of alkali-metal that is different from the desired impurity concentration of alkali-metal of the hexagonal würtzite type epitaxial layer,
   determining which of a plurality of surfaces of the hexagonal würtzite substrate has a crystal plane that diffuses the alkali-metal from the hexagonal würtzite substrate into the hexagonal würtzite type epitaxial layer at a desired level, choosing a surface from the plurality of surfaces of the hexagonal würtzite substrate having a crystal plane that diffuses the alkali-metal from the hexagonal würtzite substrate into the hexagonal würtzite type epitaxial layer at the desired level, and growing the hexagonal würtzite type epitaxial layer on the chosen surface of the hexagonal würtzite substrate to obtain the desired impurity concentration of alkali-metal of the hexagonal würtzite type epitaxial layer.

2. The method of claim 1, wherein the crystal plane is an m-plane, an a-plane, or any off-oriented plane between the m-plane and the a-plane.

3. The method of claim 1, wherein the crystal plane is a semi-polar plane.

4. The method of claim 2, wherein the hexagonal würtzite substrate comprises one or more off-orientations along a <11-20>, a [0001], a [000-1], and a <1-100> direction.

5. The method of claim 1, wherein the hexagonal würtzite type epitaxial layer contains Ga.

6. The method of claim 1, wherein the hexagonal würtzite type epitaxial layer is a III-nitride layer.

7. The method of claim 1, wherein the hexagonal würtzite substrate of the epitaxial layer contains at least one alkali-metal.

8. The method of claim 1, wherein the hexagonal würtzite type epitaxial layer contains a reduced concentration of alkali-metal as compared to the hexagonal würtzite substrate.

9. The method of claim 1, wherein the hexagonal würtzite type epitaxial layer possesses an alkali-metal concentration for each present alkali-metal of less than $10^{16}$ atoms/cm$^3$.

10. The method of claim 1, wherein the hexagonal würtzite type epitaxial layer possesses an alkali-metal concentration for an alkali-metal of less than $10^{16}$ atoms/cm$^3$.

11. A device using the hexagonal würtzite epitaxial layer produced by the method of claim 1.

12. An epitaxial film fabricated using the method of claim 1.

13. The method of claim 1, wherein the hexagonal würtzite type epitaxial layer is grown by molecular beam epitaxy (MBE), metalorganic chemical vapor deposition (MOCVD), or hydride vapor phase epitaxy (HVPE).

14. The method of claim 1, wherein the hexagonal würtzite substrate is produced by the ammonothermal method.

15. The method of claim 1, wherein the crystal plane of the hexagonal würtzite substrate is selected to control the impurity concentration of alkali-metal in the hexagonal würtzite type epitaxial layer.

16. A method of obtaining a hexagonal würtzite type epitaxial layer with a first impurity concentration on a hexagonal würtzite substrate possessing a second impurity concentration, comprising:

determining which of a plurality of surfaces of the hexagonal würtzite substrate has a specified crystal plane orientation that diffuses the impurity from the hexagonal würtzite substrate into the hexagonal würtzite type epitaxial layer at a desired level, controlling the first impurity incorporation in the hexagonal würtzite type epitaxial layer by selecting a surface from the plurality of surfaces of the hexagonal würtzite substrate having the specified crystal plane orientation that diffuses the impurity from the hexagonal würtzite substrate into the hexagonal würtzite type epitaxial layer at the desired level; and growing the hexagonal würtzite type epitaxial layer on or above the selected surface of the substrate having the specified crystal plane orientation to obtain the first impurity concentration of the hexagonal würtzite type epitaxial layer.

17. The method of claim 16, wherein the specified crystal plane orientation is a non-polar orientation or a semi-polar orientation.

18. The method of claim 16, wherein the hexagonal würtzite type epitaxial layer is a III-nitride layer.

19. The method of claim 16, wherein the substrate is produced by an ammonothermal method.

20. The method of claim 16, wherein the hexagonal würtzite type epitaxial layer is grown by molecular beam epitaxy (MBE), metalorganic chemical vapor deposition (MOCVD), or hydride vapor phase epitaxy (HVPE).

21. An epitaxial layer fabricated using the method of claim 16.

22. A device including or using the epitaxial layer of claim 21.

23. A method of growing a hexagonal würtzite type epitaxial layer having a first impurity concentration on or above a hexagonal würtzite substrate having a second impurity concentration, comprising:

determining which of a plurality of surfaces of the hexagonal würtzite substrate has a specified crystal orientation that diffuses the impurity from the hexagonal würtzite substrate into the hexagonal würtzite type epitaxial layer at a desired level, selecting a growth surface from the plurality of surfaces of the hexagonal würtzite substrate having the specified crystal orientation to control diffusion from the second impurity concentration of the hexagonal würtzite substrate into the first impurity concentration of the hexagonal würtzite type epitaxial layer at the desired level; and growing the hexagonal würtzite type epitaxial layer on or above the growth surface of the hexagonal würtzite substrate having the specified crystal orientation to obtain the first impurity concentration of the hexagonal würtzite type epitaxial layer.

* * * * *